(12) United States Patent  
Alshareef et al.

(10) Patent No.: US 7,226,826 B2  
(45) Date of Patent: Jun. 5, 2007

(54) SEMICONDUCTOR DEVICE HAVING MULTIPLE WORK FUNCTIONS AND METHOD OF MANUFACTURE THEREFOR

(75) Inventors: Husam N. Alshareef, Austin, TX (US); Mark R. Visokay, Richardson, TX (US); Antonio Luis Pacheco Rotondaro, Dallas, TX (US); Luigi Colombo, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 112 days.

(21) Appl. No.: 10/826,516

(22) Filed: Apr. 16, 2004

(65) Prior Publication Data

US 2005/0233533 A1 Oct. 20, 2005

(51) Int. Cl.  
*H01L 21/8238* (2006.01)

(52) U.S. Cl. .................. 438/199; 438/308; 438/592

(58) Field of Classification Search ............... 438/308  
See application file for complete search history.

(56) References Cited

U.S. PATENT DOCUMENTS

| | | | |
|---|---|---|---|
| 6,133,079 A * | 10/2000 | Zhu et al. ............ | 438/210 |
| 6,291,282 B1 * | 9/2001 | Wilk et al. ........... | 438/203 |
| 6,660,577 B2 | 12/2003 | Chen et al. | |
| 6,861,350 B1 * | 3/2005 | Ngo et al. ............ | 438/627 |
| 6,890,807 B2 * | 5/2005 | Chau et al. ........... | 438/199 |
| 7,071,086 B2 * | 7/2006 | Woo et al. ............ | 438/592 |
| 2002/0195679 A1 * | 12/2002 | Hu ...................... | 257/510 |
| 2003/0062577 A1 * | 4/2003 | Rotondaro et al. ..... | 257/407 |
| 2005/0101145 A1 * | 5/2005 | Visokay et al. ....... | 438/706 |
| 2005/0116230 A1 * | 6/2005 | Cabral et al. ......... | 257/69 |

OTHER PUBLICATIONS

Qiang Lu, et al.; "Metal Gate Work Function Adjustment For Future CMOS Technology"; 2001 Symposium on VLSI Technology Digest of Technical Papers; 2001 IEEE, pp. 45-46.

Pushkar Ranade, et al.; "Tunable Work Function Molybdenum Gate Technology for FDSOI-CMOS"; IEDM, 2002 IEEE; pp. 363-366.

* cited by examiner

*Primary Examiner*—Stephen W. Smoot  
(74) *Attorney, Agent, or Firm*—Peter K. McLarty; W. James Brady, III; Frederick J. Telecky, Jr.

(57) ABSTRACT

The present invention provides a semiconductor device, a method of manufacture therefor, and a method for manufacturing an integrated circuit. The semiconductor device (100), among other possible elements, includes a first transistor (120) located over a semiconductor substrate (110), wherein the first transistor (120) has a metal gate electrode (135) having a work function, and a second transistor (160) located over the semiconductor substrate (110) and proximate the first transistor (120), wherein the second transistor (160) has a plasma altered metal gate electrode (175) having a different work function.

12 Claims, 7 Drawing Sheets

SEMICONDUCTOR DEVICE HAVING MULTIPLE WORK FUNCTIONS AND METHOD OF MANUFACTURE THEREFOR

TECHNICAL FIELD OF THE INVENTION

The present invention is directed, in general, to a semiconductor device and, more specifically, to a semiconductor device having multiple work functions, a method of manufacture therefor, and a method for manufacturing an integrated circuit including the same.

BACKGROUND OF THE INVENTION

Metal gate electrodes are currently being investigated to replace polysilicon gate electrodes in today's ever shrinking and changing transistor devices. One of the principal reasons the industry is investigating replacing polysilicon gate electrodes with metal gate electrodes is to solve polysilicon depletion effects for future CMOS devices. Traditionally, polysilicon gate electrodes with overlying silicides have been used for the gate electrodes in CMOS devices. However, as device feature sizes continue to shrink, polysilicon depletion is becoming a serious issue.

Accordingly, metal gates have been proposed. However, in order to optimize the threshold voltage ($V_t$) in CMOS devices, metals with the appropriate work functions (e.g., from the silicon valence band to that of the conduction band) are required. For instance, the metal gates need tunable work functions for NMOS and PMOS devices similar to present polysilicon gate technology, requiring the work functions of metal gates to range from 4.1~4.4 eV for NMOS and 4.8~5.2 eV for PMOS (see, B. Cheng, B. Maiti, S. Samayedam, J. Grant, B. Taylor, P. Tobin, J. Mogab, *IEEE Intl. SOI Conf. Proc.*, pp. 91–92, 2001).

Unfortunately, both material and processing issues arise while attempting to manufacture metal gates having different work functions. In one example, a different metal gate material is used for the NMOS devices and the PMOS devices. Unfortunately, the integration of two different metals in a CMOS device flow is difficult, for example requiring significant changes to the CMOS process flow. Ideally, a single metal layer would be preferred, with a portion of the single metal layer being exposed to a specific process to adjust the work function of the exposed portion. This, however, is a difficult technique to perfect.

Accordingly, what is needed is a method for manufacturing metal gate structures for CMOS devices that begins with a single metal layer and adjusts a portion of the single metal layer to have a different work function than the remaining portion, without experiencing the drawbacks of the prior art methods.

SUMMARY OF THE INVENTION

To address the above-discussed deficiencies of the prior art, the present invention provides a semiconductor device, a method of manufacture therefor, and a method for manufacturing an integrated circuit. The semiconductor device, among other possible elements, includes a first transistor located over a semiconductor substrate, wherein the first transistor has a metal gate electrode having a work function, and a second transistor located over the semiconductor substrate and proximate the first transistor, wherein the second transistor has a plasma altered metal gate electrode having a different work function.

The present invention further includes a method for manufacturing a semiconductor device. The method includes forming a metal gate electrode material over a semiconductor substrate, wherein the metal gate electrode material has a work function, and subjecting at least a portion of the metal gate electrode material to a plasma process, the plasma process causing the subjected portion to have a different work function.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
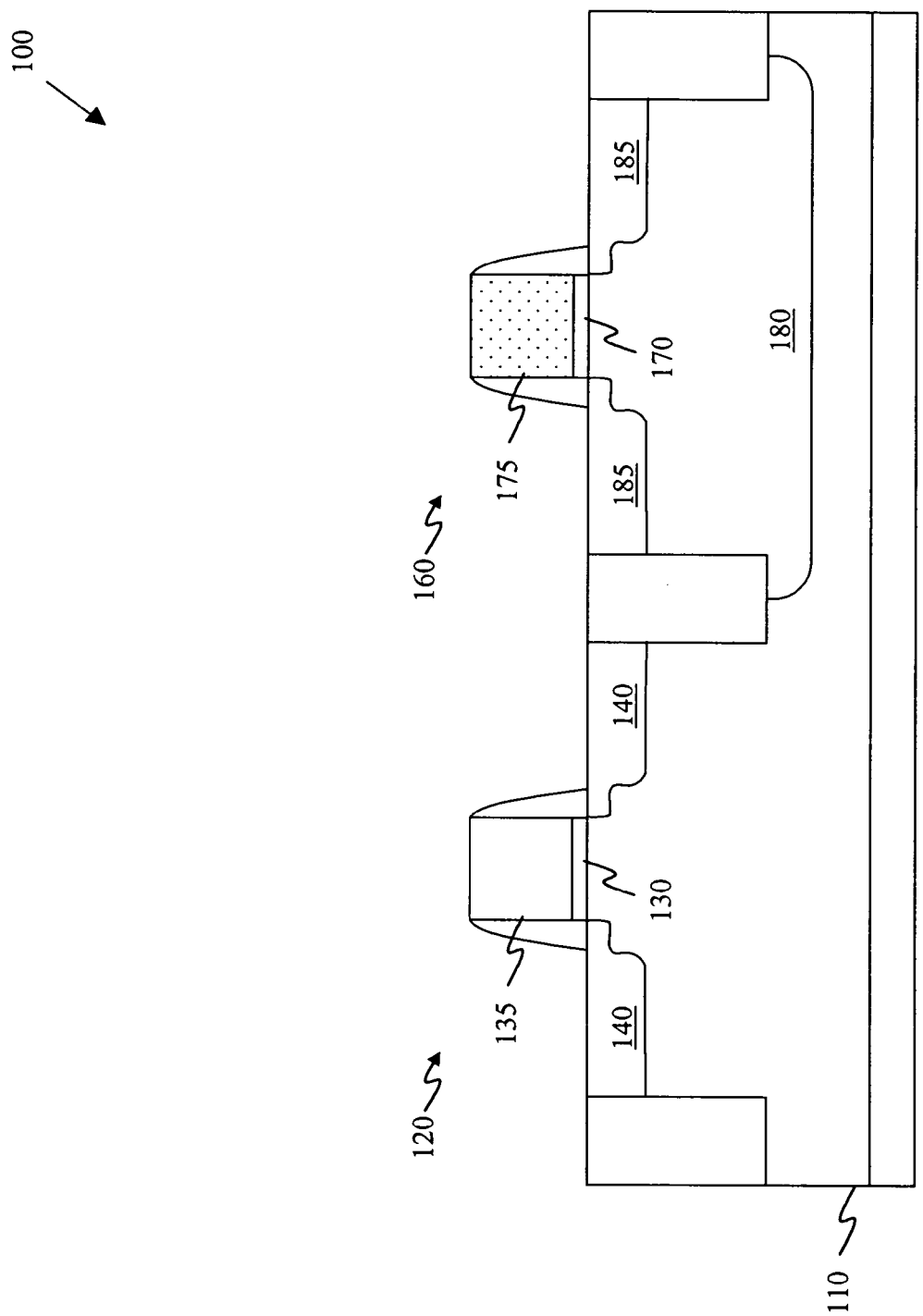
FIG. 1 illustrates a cross-sectional view of one embodiment of a semiconductor device constructed according to the principles of the present invention.

Referring initially to FIG. 1, illustrated is a cross-sectional view of one embodiment of a semiconductor device 100 constructed according to the principles of the present invention. In the embodiment illustrated in FIG. 1, the semiconductor device 100 includes a semiconductor substrate 110. Located over the semiconductor substrate 110 are a first transistor 120 and a second transistor 160. As is illustrated, the first and second transistors 120, 160, are located proximate one another. In an exemplary embodiment of the invention the first transistor 120 comprises an N-channel metal oxide semiconductor (NMOS) device and the second transistor 160 comprises a P-channel metal oxide semiconductor (PMOS) device. As one skilled in the art would appreciate, other device configurations are within the scope of the present invention.

In the illustrative embodiment shown in FIG. 1, the first transistor 120 includes a metal gate electrode 135 located over a gate dielectric 130. The metal gate electrode 135 may comprise many different metals. For instance, the metal gate electrode 135 may comprise most transition metals, including molybdenum, tantalum, and tungsten, without departing from the scope of the present invention. Other transition metals, including without limitation scandium, titanium, vanadium, chromium, cobalt, nickel, yttrium, niobium, ruthenium, rhodium, palladium, lanthanum, hafnium, rhenium, osmium, and iridium, may also be used.

The metal gate electrode 135, as one would appreciate, has a given work function. The term work function, as used throughout this document, is intended to be the minimum energy required to bring an electron from the Fermi level to the vacuum level. In the embodiment of FIG. 1 the work function of the metal gate electrode 135 is tailored for an NMOS device, and therefore should optimally range from about 4.1 eV to about 4.4 eV. In addition to the inherent work function of the particular metal used to form the metal gate electrode 135, an additional dopant may be included therein to further tailor the work function. For example, phosphorous, arsenic or antimony could conceivably be used to further tailor the work function of this NMOS device.

The first transistor 120 of FIG. 1 further includes conventional source/drain regions 140 located within the semiconductor substrate 110. The source/drain regions 140 may include lightly doped source/drain implants as well as heavily doped source/drain implants. Other conventional features neither discussed herein nor illustrated in FIG. 1 will also undoubtedly be included within the first transistor 120.

As indicated previously, located proximate the first transistor 120 is a second transistor 160. The second transistor 160, in contrast to the first transistor 120, includes a plasma altered metal gate electrode 175 located over a gate dielectric 170. Advantageously, the plasma altered metal gate electrode 175 includes the metal used to form the metal gate electrode 135. For example, in an exemplary embodiment the plasma altered metal gate electrode 175 comprises the same metal used to form the metal gate electrode 135 after being plasma nitrided or plasma oxidized. The plasma altered metal gate electrode 175 could also comprise the same metal used to form the metal gate electrode 135 after being plasma silicided or plasma germanided. It should be noted that the specific plasma process used should be tailored to the metal chosen such that the resulting material maintains metallic characteristics after being subjected to the plasma process (e.g., rather than converting to a dielectric as might be the case in certain combinations).

Unique to the present invention, the plasma altered metal gate electrode 175 has a different work function than the metal gate electrode 135. In the particular embodiment of FIG. 1, the plasma altered metal gate electrode 175 has a work function that is about 1.0 eV different than the work function of the metal gate electrode 135. As the plasma altered metal gate electrode 175 forms a portion of a PMOS device, this work function may range from about 4.8 eV to about 5.2 eV while staying within the scope of the present invention.

The second transistor 160 of FIG. 1 further includes a conventional well region 180 formed in the semiconductor substrate 110. In this embodiment the well region 180 is an N-well region, however, the well region 180 could be a P-well region if the second transistor 160 were an NMOS device. Located within the well region 180 are conventional source/drain regions 185. As mentioned before, the source/drain regions 185 may include lightly doped source/drain implants as well as heavily doped source/drain implants. Again, other conventional features neither discussed herein nor illustrated in FIG. 1 will undoubtedly be included within the second transistor 160.

The text describing the embodiment of FIG. 1 discusses an example where the plasma altered metal gate electrode 175 forms a portion of a PMOS device. It should be noted that in an alternative embodiment, depending on the base metal used to form the metal gate electrode 135 and plasma altered metal gate electrode 175 as well as the particular plasma process used, the plasma altered metal gate electrode 175 could form a portion of an NMOS device. Consequently, the plasma altered metal gate electrode of the present invention is not limited to PMOS devices, but may also be used for NMOS devices given the appropriate conditions.

Figure 2:
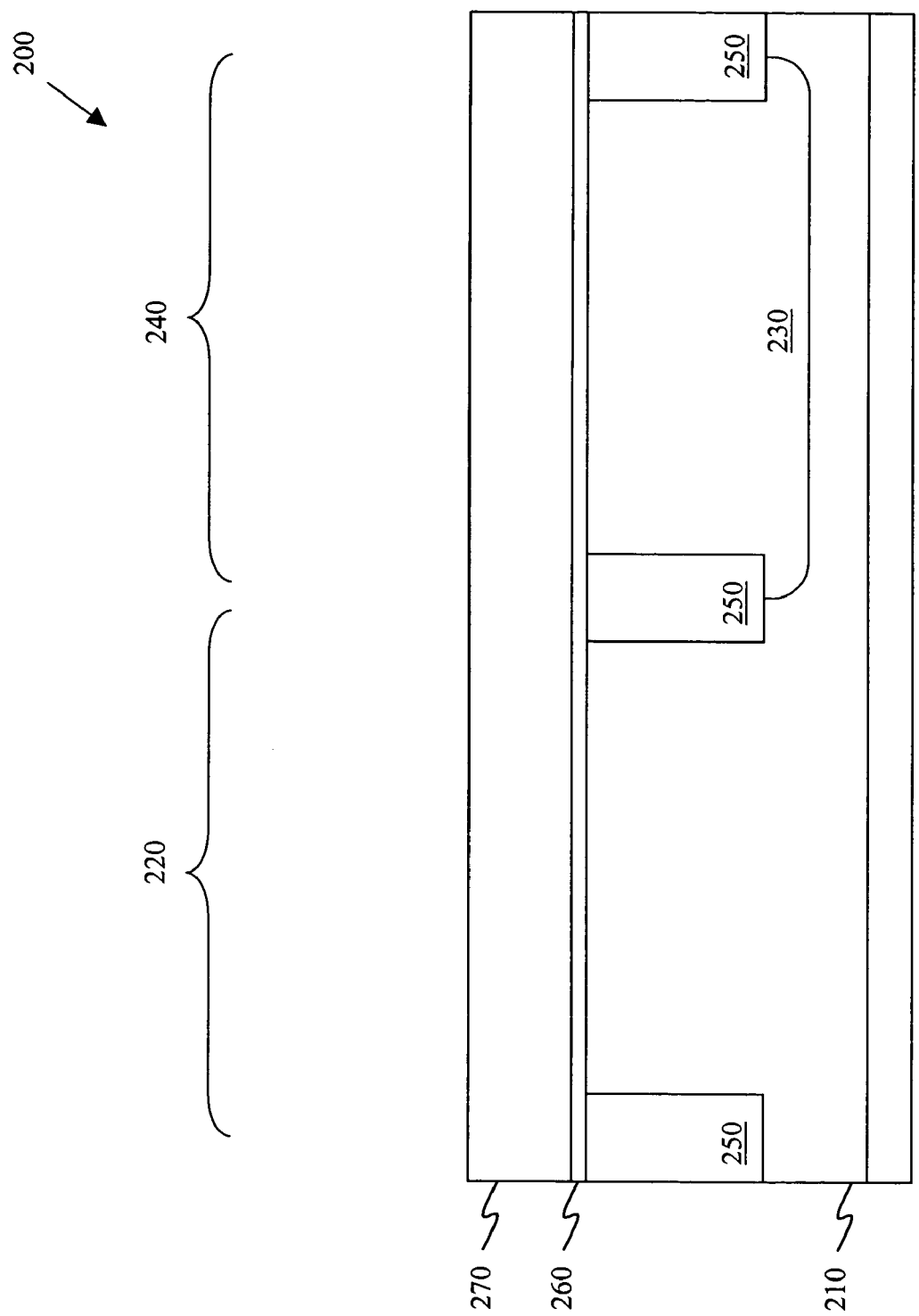
FIG. 2 illustrates a cross-sectional view of a partially completed semiconductor device manufactured in accordance with the principles of the present invention.

Turning to FIGS. 2–6, illustrated are cross-sectional views of detailed manufacturing steps instructing how one might, in an advantageous embodiment, manufacture a semiconductor device similar to the semiconductor device 100 depicted in FIG. 1. FIG. 2 illustrates a cross-sectional view of a partially completed semiconductor device 200. The partially completed semiconductor device 200 includes a semiconductor substrate 210. The semiconductor substrate 210 may, in an exemplary embodiment, be any layer located in the partially completed semiconductor device 200, including a wafer itself or a layer located above the wafer (e.g., epitaxial layer, silicon layer of a silicon-on-insulator (SOI) substrate, or another substrate). In the embodiment illustrated in FIG. 2, the semiconductor substrate 210 is a P-type substrate; however, one skilled in the art understands that the semiconductor substrate 210 could be an N-type substrate, without departing from the scope of the present invention. In such a case, each of the dopant types described throughout the remainder of this document might be reversed. For clarity, no further reference to this opposite scheme will be discussed.

The embodiment of the partially completed semiconductor device 200 illustrated in FIG. 2, includes two device regions. The two device regions consist of an NMOS device region 220 and a PMOS device region 240. The PMOS device region 240 illustrated in FIG. 2 currently includes a conventional well region 230. The well region 230, in light of the P-type semiconductor substrate 210, would more than likely contain an N-type dopant. For example, the well region 230 would likely be doped with an N-type dopant dose ranging from about 1E13 atoms/cm$^2$ to about 1E14 atoms/cm$^2$ and at an energy ranging from about 100 keV to about 500 keV. This results in the well region 230 having a peak dopant concentration ranging from about 5E17 atoms/cm$^3$ to about 1E19 atoms/cm$^3$. In the embodiment of FIG. 2, the P-type semiconductor substrate 210 acts as the well region for the NMOS device region 220.

Extending into the semiconductor substrate 210 and separating the NMOS device region 220 and the PMOS device region 240 are isolation structures 250. The isolation structures 250, as one would imagine, may comprise any known or hereafter discovered isolation structure. For instance, while the isolation structures 250 of FIG. 2 are illustrated as shallow trench isolation structures, the isolation structures 250 could have just as easily been LOCOS isolation structures while remaining within the scope of the present invention.

Located over the semiconductor substrate 210 is a blanket layer of gate dielectric material 260. The blanket layer of gate dielectric material 260 may comprise a number of different materials and stay within the scope of the present invention. For example, the blanket layer of gate dielectric material 260 may comprise silicon dioxide ($SiO_2$), nitrided silicon dioxide, or in an alternative embodiment comprise a high dielectric constant (high-K) material. In the illustrative embodiment of FIG. 2, however, the blanket layer of gate dielectric material 260 is a nitrided silicon dioxide layer having a thickness ranging from about 1 nm to about 5 nm.

Any one of a plurality of manufacturing techniques could be used to form the blanket layer of gate dielectric material 260. For example, the blanket layer of gate dielectric material 260 may be either grown or deposited. Additionally, the growth or deposition steps may require a significant number of different temperatures, pressures, gasses, flow rates, etc.

Located over the blanket layer of gate dielectric material 260 is a blanket layer of metal gate electrode material 270. The blanket layer of metal gate electrode material 270 may, similar to the blanket layer of gate dielectric material 260, comprise a number of different materials while remaining within the scope of the present invention. In the particular embodiment illustrated in FIG. 2 the blanket layer of metal gate electrode material 270 comprises a transition metal. Other known metals may work equally as well.

The blanket layer of metal gate electrode material 270 may be formed using a number of different known processes. For instance, the blanket layer of metal gate electrode material 270 may be deposited using several different techniques, including physical vapor deposition (e.g., sputtering), atomic layer deposition (ALD), chemical vapor deposition (CVD), or any other film deposition technique that allows metal film deposition from very small amounts to tens of nanometers, as well as laser ablation and evaporation. Although the deposition conditions for the blanket layer of metal gate electrode material 270 may vary depending on the metal and deposition process used, in one embodiment of the invention it is believed that the blanket layer of metal gate electrode material 270 may be deposited using a pressure ranging from about 1 milliTorr to about 50 milliTorr, a temperature ranging from about ambient temperature to about 500° C., and a gas flow ranging from about 1 sccm to about 5000 sccm. Other deposition conditions are, however, within the scope of the present invention. The resulting blanket layer of metal gate electrode material 270 would advantageously have a thickness ranging from about 3 nm to about 100 nm, and more preferably from about 5 nm to about 20 nm.

Figure 3:
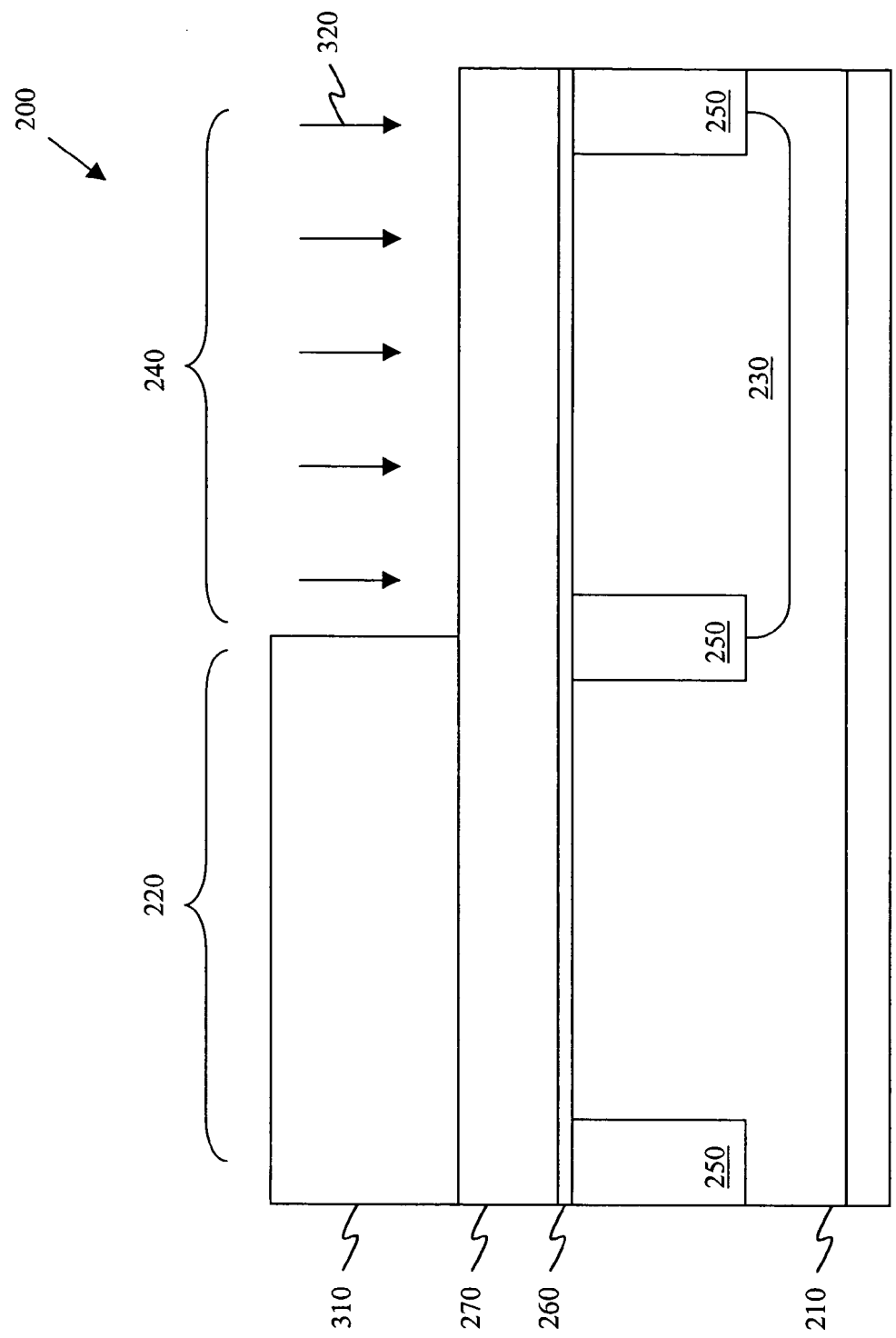
FIG. 3 illustrates a cross-sectional view of the partially completed semiconductor device shown in FIG. 2 after forming a masking layer over portions of the blanket layer of metal gate electrode material and subjected any exposed portions to a plasma process.

Turning now to FIG. 3 illustrated is a cross-sectional view of the partially completed semiconductor device 200 shown in FIG. 2 after forming a masking layer 310 over portions of the blanket layer of metal gate electrode material 270 and subjecting any exposed portions to a plasma process 320. The masking layer 310, as can be appreciated, may comprise a photoresist mask, hard mask, another similar mask or any collection of those masks while staying within the scope of the present invention. For instance, while the masking layer 310 illustrated in FIG. 3 is only a single photoresist mask, a dual photoresist/hard mask could conceivably be used. In the illustrative embodiment shown in FIG. 3 the masking layer 310 is only located over the NMOS device region 220 and not over the PMOS device region 240. Accordingly, only the PMOS device region 240 is exposed to the plasma process 320 in this embodiment.

The plasma process 320, which is unique to the present invention, is advantageously used to change the work function of the exposed portion of the blanket layer of metal gate electrode material 270. For instance, depending on the plasma process conditions and the metal used for the blanket layer of metal gate electrode material 270, it is envisioned that the plasma process 320 may change the work function of the exposed portion of the blanket layer of metal gate electrode material 270 by up to about 1.1 eV.

The plasma process conditions may vary greatly, particularly depending on whether an RF or microwave plasma process is being used. Nonetheless, a process power ranging from about 300 watts to about 3000 watts, a process pressure ranging from about 1 milliTorr to about 1500 milliTorr and a substrate temperature ranging from about ambient temperature to about 750° C. (preferably from about 500° C. to about 700° C.) have exhibited good results. Similarly, the gasses used for the plasma process may vary. For instance, if the plasma process is a plasma nitridation process, nitrogen gas or a nitrogen containing gas (e.g., N, $N_2$, $NH_3$, etc.) could be used. On the other hand, if the plasma process were a plasma oxidation process, oxygen or an oxygen containing gas (e.g., O, $O_2$, $O_3$, etc.) could be used. If the plasma process were a plasma silicidation process a silicon containing gas (e.g., $SiH_4$, $Si_2H_6$, etc.) could be used. If the plasma process were a plasma germanidation process a germanium containing gas (e.g., $GeH_4$) could be used. Let it be known again, however, that the plasma process and the particular metal used should be chosen such that the resulting layer remains conductive. Exemplary metals that could be used for the plasma oxidation include, without limitation, ruthenium, iridium, osmium, indium and tin. As those skilled in the art would expect, other gasses, including argon and helium, might be used to dilute the main plasma process gasses.

It should be noted again that the region that is being subjected to the plasma process 320 (i.e., whether the PMOS region is being subjected the plasma process or the NMOS region is being subjected to the plasma process) is dependent on whether the blanket layer of metal gate electrode material 270 has a low work function that needs to be increased for the opposing device, or whether the blanket layer of metal gate electrode material 270 has a high work function that needs to be decreased for the opposing device. For instance, in the case where the blanket layer of metal gate electrode material 270 has a work function close to 4 eV, as is the case for tantalum, titanium, hafnium, zirconium, etc., the PMOS device region would be subjected to the plasma process 320 to bring the work function of that region up to the desired value for the PMOS device. Conversely, if the blanket layer of metal gate electrode material 270 were to have a work function closer to 5 eV, as is the case with molybdenum, tungsten, etc., the PMOS device region 240 would be masked and the NMOS device region 220 would be subjected to the plasma process 320. Accordingly, while the embodiment described with respect to FIGS. 2–6 discusses that the PMOS device region 240 is subjected to the plasma process 320, those skilled in the art understand that the inverse might occur, depending on the blanket layer of metal gate electrode material 270 chosen and the plasma process 320 used.

Figure 4:
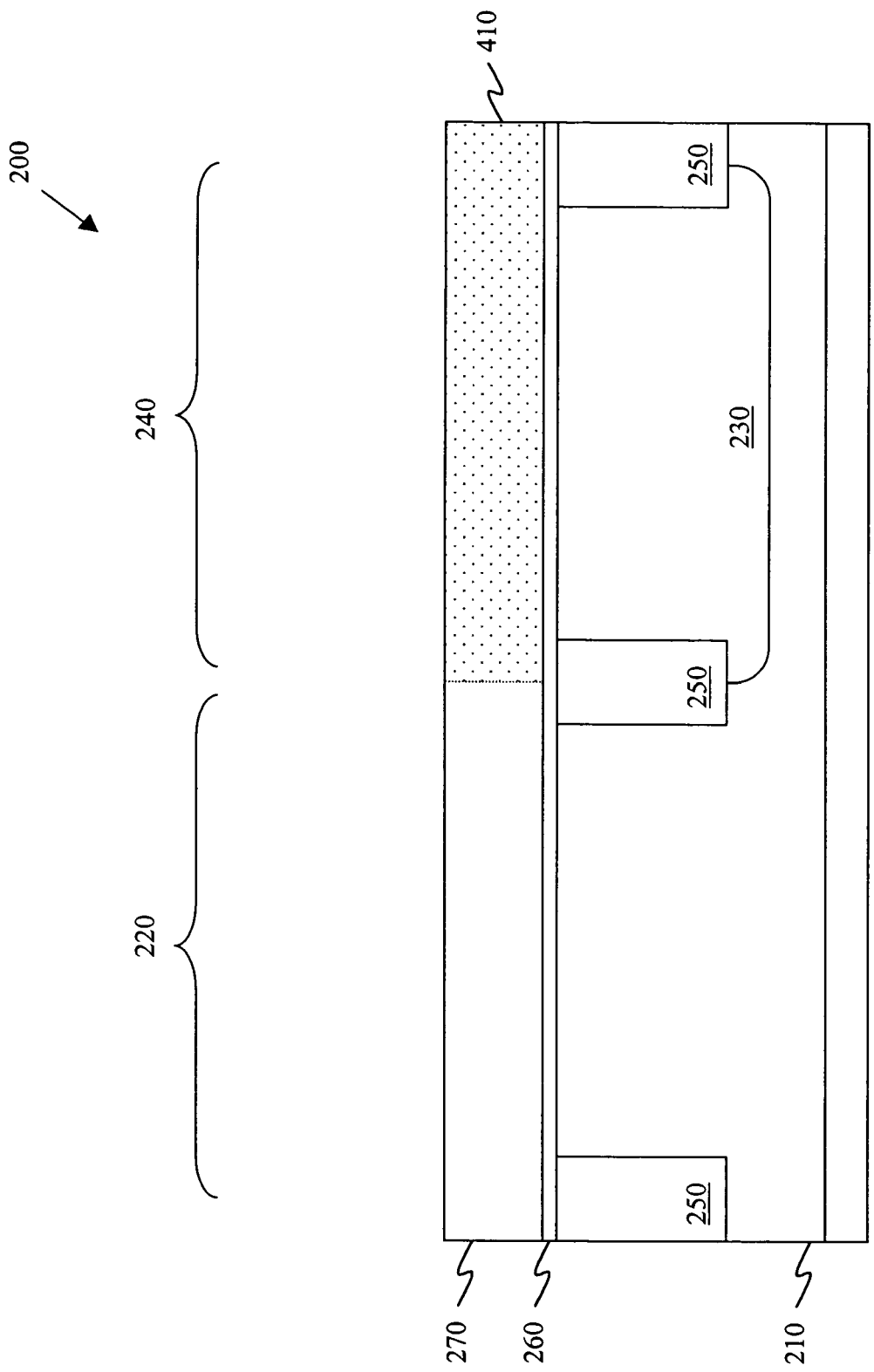
FIG. 4 illustrates a cross-sectional view of the partially completed semiconductor device shown in FIG. 3 after the exposed portion of the blanket layer of metal gate electrode material is subjected to the plasma process, thereby forming a blanket layer of metal gate electrode material having a different work function.

Turning now to FIG. 4 illustrated is a cross-sectional view of the partially completed semiconductor device 200 shown in FIG. 3 after the exposed portion of the blanket layer of metal gate electrode material 270 is subjected to the plasma process 320, thereby forming a blanket layer of metal gate electrode material 410 having a different work function. In the particular embodiment of FIG. 4, the plasma process changed the work function from a value ranging from about 4.1 eV to about 4.4 eV to a value ranging from about 4.8 eV to about 5.2 eV. Other work function values may nonetheless be achieved.

Figure 5:
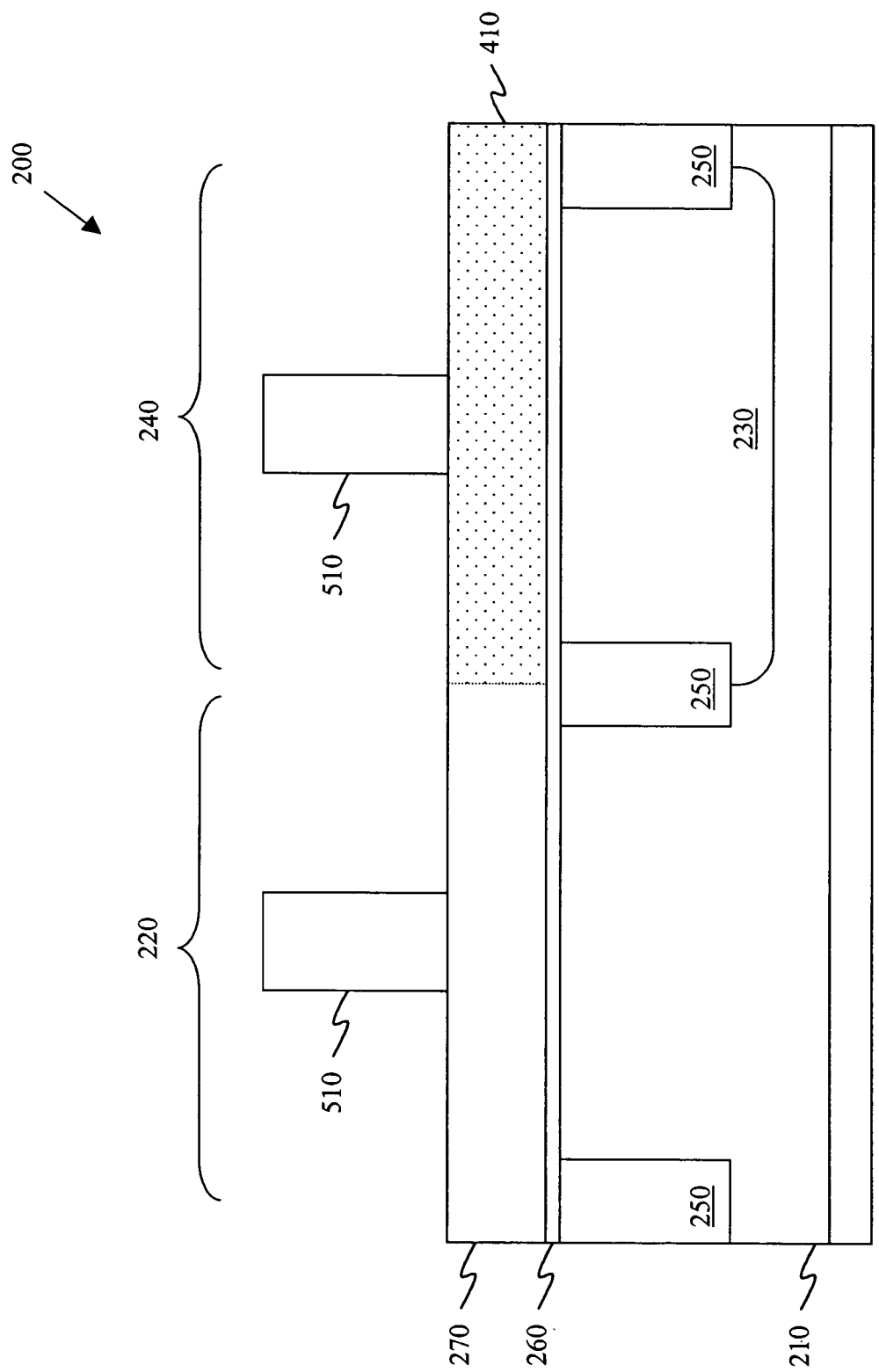
FIG. 5 illustrates a cross-sectional view of the partially completed semiconductor device illustrated in FIG. 4 after forming mask portions over distinct regions of the PMOS device region and NMOS device region.

After completing the blanket layer of metal gate electrode material 410 having a different work function, an optional barrier layer, such as a nitrided metal (e.g., tungsten nitride, titanium nitride, tantalum nitride, etc.) and cladding layer (e.g., polysilicon, molybdenum, tungsten, titanium nitride, etc.) may be deposited thereon. The optional barrier layer attempts to prevent the cladding layer from potentially reacting with the underlying blanket layer of metal gate electrode material 270 and blanket layer of metal gate electrode material 410 having the different work function. This advantageous embodiment might be used when the thickness of the original blanket layer of metal gate electrode material 270 is insufficient for a required gate height. In this instance, the barrier layer having a thickness ranging from about 1 nm to about 50 nm and the cladding layer having a thickness ranging from about 1 nm to about 200 nm may be deposited on the original blanket layer of metal gate electrode material 270 and blanket layer of metal gate electrode material 410 having a different work function, prior to patterning the gate electrodes as illustrated in FIG. 5 below. Similarly, the additional layers may be used to reduce the overall gate stack sheet resistance. For instance, the use of a low resistivity cladding layer relaxes the choice of the metal (and altered metal) that may be used, since the resistivity of these layers are no longer as important.

Turning now to FIG. 5, illustrated is a cross-sectional view of the partially completed semiconductor device 200 illustrated in FIG. 4 after forming mask portions 510 over regions of the NMOS device region 220 and PMOS device region 240. The process used to form and define the mask portions 510 is conventional. Accordingly, no further detail will be given. In an exemplary embodiment, however, the mask portions 510 should have a width of greater than about 1 nm while staying within the scope of the present invention.

Figure 6:
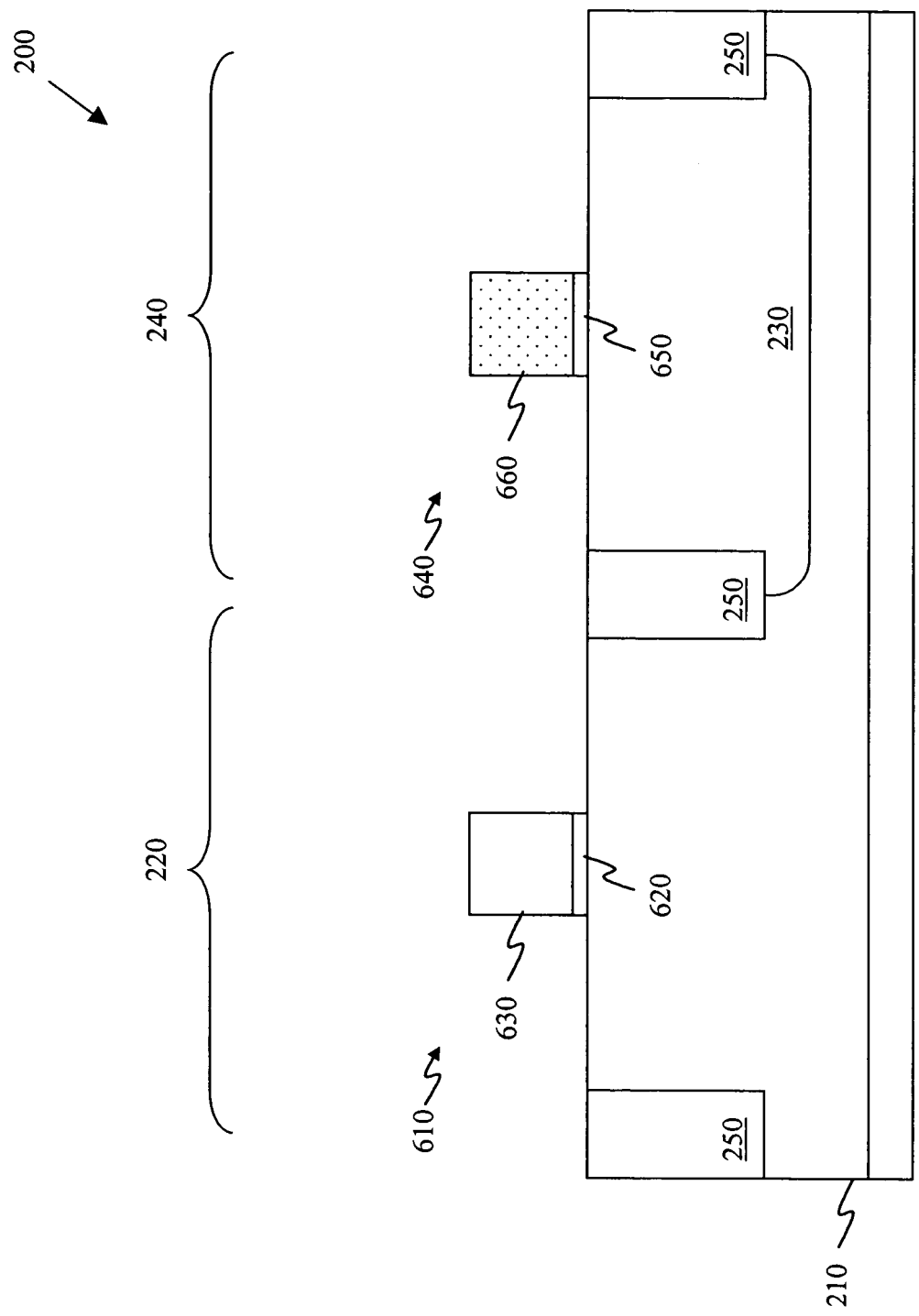
FIG. 6 illustrates a cross-sectional view of the partially completed semiconductor device illustrated in FIG. 5 after patterning the blanket layer of metal gate electrode material and blanket layer of gate dielectric material, resulting in a first transistor and a second transistor.

Turning now to FIG. 6, illustrated is a cross-sectional view of the partially completed semiconductor device 200 illustrated in FIG. 5 after patterning the blanket layer of metal gate electrode material 270, blanket layer of metal gate electrode material 410 having the different work function, and the blanket layer of gate dielectric material 260, resulting in a first transistor 610 and a second transistor 640. As one would expect, the resulting first transistor 610 includes a metal gate electrode 630 located over a gate dielectric 620, wherein the metal gate electrode 630 has a work function. On the other hand, the resulting second transistor 640 includes a plasma altered metal gate electrode 660 located over a gate dielectric 650, wherein the plasma altered metal gate electrode 660 has a different work function than the metal gate electrode 630. The resulting first and second transistors 610, 640, may then be subjected to conventional manufacturing techniques resulting in a device similar to the semiconductor device 100 illustrated in FIG. 1.

Advantageous to the present invention is the relatively easy and inexpensive process that may be used to form dual work function metal gate CMOS devices. As compared to the prior art dual work function metal gate CMOS devices, the semiconductor devices of the present invention are much easier to manufacture, requiring at least one less manufacturing step. For example, as compared to the prior art methods, the inventive method of the present invention does not require an anneal step to form the appropriate bonds (e.g., metal nitrogen bonds or metal oxygen bonds) within the metal gate CMOS devices. While an anneal step may be used, it is not required as it is in the prior art devices. As fewer steps are required, the cost of manufacturing the metal gate CMOS devices may reduce.

Figure 7:
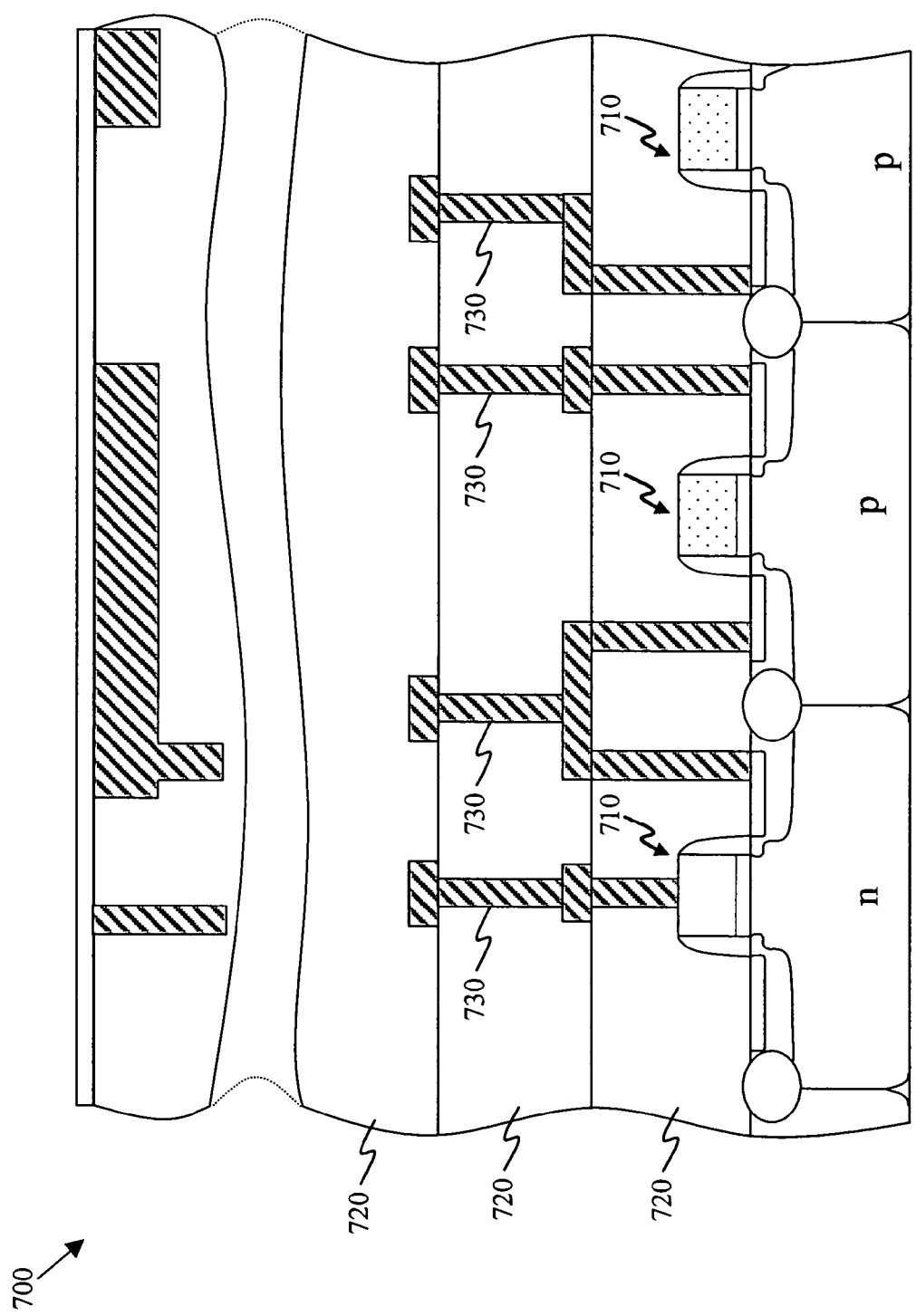
FIG. 7 illustrates an exemplary cross-sectional view of an integrated circuit (IC) incorporating devices constructed according to the principles of the present invention.

Referring finally to FIG. 7, illustrated is an exemplary cross-sectional view of a conventional integrated circuit (IC) 700 incorporating a semiconductor device 710 constructed according to the principles of the present invention. The IC 700 may include devices, such as transistors used to form CMOS devices, BiCMOS devices, Bipolar devices, as well as capacitors or other types of devices. The IC 700 may further include passive devices, such as inductors or resistors, or it may also include optical devices or optoelectronic devices. Those skilled in the art are familiar with these various types of devices and their manufacture. In the particular embodiment illustrated in FIG. 7, the IC 700 includes the semiconductor devices 710 having dielectric layers 720 located thereover. Additionally, interconnect structures 730 are located within the dielectric layers 720 to interconnect various devices, thus, forming the operational integrated circuit 700.

Although the present invention has been described in detail, those skilled in the art should understand that they can make various changes, substitutions and alterations herein without departing from the spirit and scope of the invention in its broadest form.

What is claimed is:

1. A method for manufacturing a semiconductor device, comprising:

forming a single layer metal gate electrode material over a semiconductor substrate, wherein the metal gate electrode material has a work function;

subjecting at least a portion of the metal gate electrode material to at least one of a plasma silicidation or plasma germanidation process to cause the portion to be converted into a plasma altered metal gate electrode and have a different work function;

patterning the metal gate electrode material having the work function and patterning the portion of the metal gate electrode material having the different work function to form a first gate electrode having the work function and a second gate electrode having the different work function; and forming source/drain regions proximate the first gate electrode and second gate electrode.

2. The method as recited in claim 1 further including forming a cladding layer over the metal gate electrode material having the work function and the metal gate electrode material having the different work function prior to the patterning, wherein the cladding layer reduces a sheet resistance of the first gate electrode and the second gate electrode.

3. The method as recited in claim 2 wherein the cladding layer is selected from the group of materials consisting of polysilicon, molybdenum, tungsten, and titanium nitride.

4. The method as recited in claim 1 wherein the layer of gate electrode material comprises a material selected from the group consisting of molybdenum, tantalum, and tungsten.

5. The method as recited in claim 1 further including forming a protective layer over the layer of gate electrode material and leaving the portion exposed, wherein forming the protective layer occurs prior to subjecting the portion to the plasma process.

6. The method as recited in claim 1 wherein the second gate electrode material having the different work function is about 1 .eV different than that of the first gate electrode material having the work function.

7. The method as recited in claim 1 wherein the different work function of the second gate electrode material is selectively adjusted relative to the work function of the first gate electrode material.

8. A method for manufacturing an integrated circuit, comprising:
   forming transistors over a semiconductor substrate, including;
   forming a single layer metal gate electrode material over the semiconductor substrate, wherein the metal gate electrode material has a work function;
   subjecting at least a portion of the metal gate electrode material to at least one of a plasma silicidation or plasma germanidation process to cause the portion to be converted into a plasma altered metal gate electrode and have a different work function; and
   patterning the metal gate electrode material having the work function and patterning the portion of the metal gate electrode material having the different work function to form a first gate electrode having the work function and a second gate electrode having the different work function;
   forming source/drain regions proximate the first pate electrode and second pate electrode; and
   forming interconnects within dielectric layers located over the transistors.

9. The method as recited in claim 8 wherein the layer of gate electrode material comprises a material selected from the group consisting of molybdenum, tantalum, and tungsten.

10. The method as recited in claim 8 further including forming a protective layer over the layer of gate electrode material and leaving the portion exposed, wherein forming the protective layer occurs prior to subjecting the portion to the plasma process.

11. The method as recited in claim 8 further including forming a cladding layer over the metal gate electrode material having the work function and the metal gate electrode material having the different work function prior to the patterning, wherein the cladding layer reduces a sheet resistance of the first gate electrode and the second gate electrode.

12. The method as recited in claim 11 wherein the cladding layer is selected from the group of materials consisting of polysilicon, molybdenum, tungsten, and titanium nitride.

* * * * *